United States Patent
Koba et al.

(10) Patent No.: US 10,355,325 B2
(45) Date of Patent: Jul. 16, 2019

(54) METHOD FOR REUSING VEHICLE RECHARGEABLE BATTERY

(71) Applicants: PRIMEARTH EV ENERGY CO., LTD., Kosai-shi, Shizuoka (JP); TOYOTA JIDOSHA KABUSHIKI KAISHA, Toyota-shi, Aichi-ken (JP)

(72) Inventors: Daisuke Koba, Toyohashi (JP); Shinichiro Ito, Kosai (JP); Yasushi Nakagiri, Kyotanabe (JP); Tamotsu Fukuma, Kosai (JP); Kouichi Ichikawa, Kasugai (JP); Yasuhiro Takahashi, Miyoshi (JP); Masahiko Mitsui, Toyota (JP)

(73) Assignees: PRIMEARTH EV ENERGY CO., LTD., Kosai-Shi (JP); TOYOTA JIDOSHA KABUSHIKI KAISHA, Toyota-Shi (JP)

( * ) Notice: Subject to any disclaimer, the term of this patent is extended or adjusted under 35 U.S.C. 154(b) by 374 days.

(21) Appl. No.: 15/041,882

(22) Filed: Feb. 11, 2016

(65) Prior Publication Data

US 2016/0240898 A1 Aug. 18, 2016

(30) Foreign Application Priority Data

Feb. 17, 2015 (JP) ................ 2015-028457

(51) Int. Cl.
*H01M 10/54* (2006.01)
*B60L 50/50* (2019.01)
(Continued)

(52) U.S. Cl.
CPC ............. *H01M 10/54* (2013.01); *B60L 50/50* (2019.02); *G01R 31/389* (2019.01);
(Continued)

(58) Field of Classification Search
CPC .......... H01M 6/50; H01M 6/52; H01M 10/44; H01M 10/54; H01M 2220/20;
(Continued)

(56) References Cited

U.S. PATENT DOCUMENTS 7,136,762 B2 * 11/2006 Ono ................ G01R 31/3828
702/63
7,964,299 B2 * 6/2011 Hashimoto ............ C22B 7/005
29/426.1
(Continued)

FOREIGN PATENT DOCUMENTS

JP 2010-273412 A 12/2010
JP 2011-216328 A 10/2011
(Continued)

OTHER PUBLICATIONS

JP Office Action dated Aug. 23, 2016 as received in Application No. 2015028457.
(Continued)

*Primary Examiner* — Carl J Arbes
(74) *Attorney, Agent, or Firm* — Maschoff Brennan

(57) ABSTRACT

A method for reusing a vehicle rechargeable battery to rebuild an assembled battery from a plurality of battery units having a usage history is provided. The method includes measuring a remaining charge of each of a plurality of battery units obtained by dismantling an assembled battery having a usage history. The method further includes selecting from the battery units a battery unit in which the measured remaining charge is greater than or equal to a remaining charge lower limit value, which is set in a range that is greater than zero and less than a lower limit value of a remaining charge control range of a vehicle in which the assembled battery was installed, and assembling a new assembled battery using the selected battery unit.

8 Claims, 2 Drawing Sheets

(51) Int. Cl.
  *H01M 10/44* (2006.01)
  *G01R 31/3842* (2019.01)
  *G01R 31/389* (2019.01)
(52) U.S. Cl.
  CPC ......... *G01R 31/3842* (2019.01); *H01M 10/44* (2013.01); *H01M 2220/20* (2013.01); *Y02T 10/7005* (2013.01); *Y02W 30/84* (2015.05)
(58) Field of Classification Search
  CPC ... B60L 50/50; G01R 31/3842; G01R 31/389; Y02W 30/84
  See application file for complete search history.

(56) References Cited

U.S. PATENT DOCUMENTS

| | | | |
|---|---|---|---|
| 9,201,118 | B2 | 12/2015 | Uchida et al. |
| 2008/0315835 | A1 | 12/2008 | Okumura et al. |
| 2011/0239445 | A1 | 10/2011 | Ibi et al. |
| 2012/0178014 | A1* | 7/2012 | Ohtsuka .............. H01M 4/8605 429/480 |
| 2012/0249152 | A1 | 10/2012 | Nishibayashi et al. |
| 2014/0015537 | A1* | 1/2014 | Uchida .............. G01R 31/3606 324/434 |
| 2014/0218042 | A1 | 8/2014 | Koba et al. |
| 2015/0093611 | A1* | 4/2015 | Obata ................ G01R 31/3679 429/61 |

FOREIGN PATENT DOCUMENTS

| | | |
|---|---|---|
| JP | 2011-216329 A | 10/2011 |
| JP | 2012-205437 A | 10/2012 |
| JP | 2014-020818 A | 2/2014 |
| WO | 2013/076565 A1 | 5/2013 |
| WO | 2013/115038 A1 | 8/2013 |

OTHER PUBLICATIONS

Extended European Search Report dated Nov. 11, 2016 as received in Application No. 16155738.4.

* cited by examiner

METHOD FOR REUSING VEHICLE RECHARGEABLE BATTERY

CROSS-REFERENCE TO RELATED APPLICATIONS

This application is based upon and claims the benefit of priority from prior Japanese Patent Application No. 2015-028457, filed on Feb. 17, 2015, the entire contents of which are incorporated herein by reference.

FIELD

This disclosure relates to a method for reusing a rechargeable battery that is installed in a vehicle such as an electric automobile or a hybrid automobile.

BACKGROUND

An assembled battery, which is a rechargeable battery, is used to power a vehicle such as an electric automobile or a hybrid automobile. The assembled battery includes a plurality of battery units connected in series or in parallel. Studies have been conducted on such assembled batteries to develop a technique for dismantling assembled batteries that have been collected to take out battery units and reconstruct (rebuild) assembled batteries using reusable ones of the battery units. However, assembled batteries having a usage history (i.e., used assembled batteries) have different voltages due to overcharging, over-discharging, or memory effect. Further, battery properties such as the battery capacity change in such assembled batteries. Thus, it is suggested that battery units having superior battery properties be selected and combined to rebuild an assembled battery.

To select battery units having superior battery properties, the battery units need to be evaluated. Japanese Laid-Open Patent Publication No. 2011-216328 describes a conventional evaluation method for selecting a battery unit (battery module) that is used for rebuilding when the battery properties of the battery unit such as the open end voltage, the internal resistance, and the remaining charge amount are within an absolute tolerable range, which is set regardless of the assembled battery, and the battery properties are also within a relative tolerable range, which is set for each assembled battery. The relative tolerable range is a range of variations tolerated for each assembled battery and varies in accordance with the assembled battery.

SUMMARY

Even when selected as having superior battery properties in the conventional evaluation method, the selected battery units may include a battery unit that is not suitable for rebuilding. Therefore, a method for accurately evaluating the battery unit needs to be established.

Accordingly, it would be desirable to provide a method for reusing a vehicle rechargeable battery that accurately evaluates a battery unit and uses the evaluated battery unit to rebuild an assembled battery.

One aspect of this disclosure is a method for reusing a vehicle rechargeable battery to rebuild an assembled battery from a plurality of battery units having a usage history. The method includes measuring a remaining charge of each of a plurality of battery units obtained by dismantling an assembled battery having a usage history. The method further includes selecting from the plurality of battery units a battery unit in which the measured remaining charge is greater than or equal to a remaining charge lower limit value. The remaining charge lower limit value is set in a range that is greater than zero and less than a lower limit value of a remaining charge control range of a vehicle in which the assembled battery was installed. The method further includes assembling a new assembled battery using the selected battery unit.

Other aspects and advantages of this disclosure will become apparent from the following description, taken in conjunction with the accompanying drawings, illustrating by way of example the principles of the invention.

BRIEF DESCRIPTION OF THE DRAWINGS

The embodiments, together with objects and advantages thereof, may best be understood by reference to the following description of the presently preferred embodiments together with the accompanying drawings in which.

DESCRIPTION OF THE EMBODIMENTS

One embodiment of a method for reusing a vehicle rechargeable battery will now be described. In the present embodiment, a battery module including a plurality of battery cells is referred to as a battery unit. However, the battery unit is not limited to such a battery module. An assembled battery includes a plurality of battery modules.

The assembled battery is installed in a vehicle such as an electric automobile or a hybrid automobile as the driving power source. In the assembled battery, the battery modules are electrically connected in series. Each battery module is elongated box-shaped and accommodates a plurality of battery cells, which are connected in series, in an integrated battery container. Each battery cell is a nickel-metal hydride battery and includes a positive electrode, which contains nickel hydroxide as a positive active material, and a negative electrode, which contains a hydrogen adsorption alloy as a negative active material.

Figure 1:
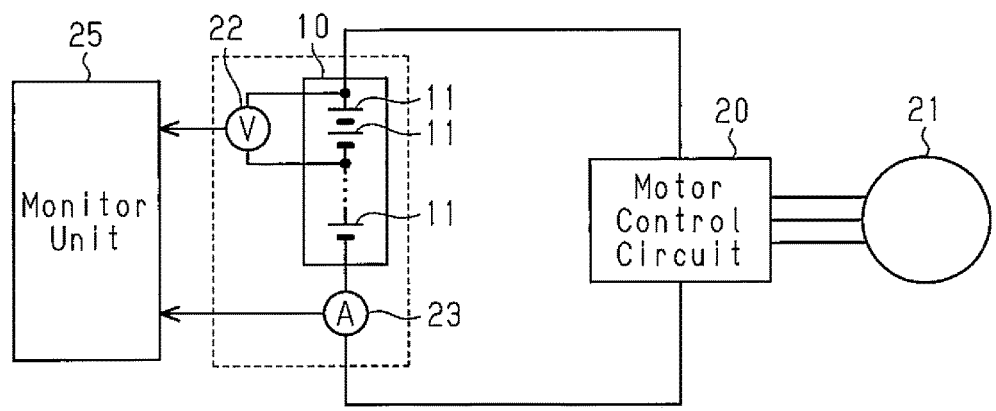
FIG. 1 is a schematic diagram illustrating the structure of a control system for a vehicle powered by an assembled battery.

An assembled battery 10, which is installed in a vehicle such as an electric automobile or a hybrid automobile, will now be described with reference to FIG. 1. The assembled battery 10, which is connected to a motor generator 21 via a motor control circuit 20 including an inverter, supplies power to the motor generator 21. The motor generator 21, which functions as the drive source of the vehicle, transmits rotation force to vehicle wheels.

Additionally, the vehicle is capable of performing regeneration braking, which converts kinetic energy of the rotation of the wheels into electric power. The motor generator 21 generates power with the rotation force transmitted from the wheels and supplies the power to the assembled battery 10 through the motor control circuit 20 to charge the assembled battery 10. When the vehicle is a hybrid automobile including an engine, power generated by a generator, which is mechanically connected to the engine, may be supplied to the assembled battery 10.

A monitor unit 25 monitors a remaining charge, which indicates the amount of power remained in the assembled battery 10. The monitor unit 25 is connected to a voltage meter 22 and a current meter 23. In the present embodiment, the assembled battery 10 includes a plurality of blocks, each of which includes at least two battery modules 11. The voltage meter 22 detects the battery voltage of each block and generates a voltage detection signal. The current meter 23 detects current flowing to the assembled battery 10 and generates a current detection signal. The monitor unit 25 estimates the state of charge (SOC), which indicates the charge ratio of the assembled battery 10, based on the battery voltage obtained from the voltage meter 22 and the current obtained from the current meter 23.

The monitor unit 25 or an electronic control unit (not illustrated), which is connected to the monitor unit 25, performs control so that the remaining charge of the assembled battery 10 is in a remaining charge control range, which is appropriate to the controlling of the vehicle. In the present embodiment, the monitor unit 25 or the electronic control unit controls the driving of the vehicle so that the SOC of the assembled battery 10 is in a control range, which is from an SOC lower limit value to an SOC upper limit value. To drive the vehicle in various driving environments, it is preferred that the SOC lower limit value be 30% or greater and, more preferably, 40% or greater. Additionally, it is preferred from the viewpoint of assuredly collecting regenerated power in the assembled battery 10 that the SOC upper limit value be 90% or less and, more preferably, 80% or less.

The usage history of the assembled battery 10 varies in each vehicle. Thus, when collected, each assembled battery 10 has different battery properties. Additionally, each battery module 11 has different battery properties in correspondence with the individual variability of the battery module 11. For example, the temperature of the battery module 11 located in the middle of the assembled battery 10 is easily increased as compared to that of the battery modules 11 located at two ends of the assembled battery 10. Thus, the SOC of the battery module 11 located in the middle of the assembled battery 10 is easily decreased as compared to that of the battery modules 11 located at the two ends of the assembled battery 10.

When using reusable battery modules 11, which are obtained by dismantling collected assembled batteries 10, to reconstruct and rebuilt an assembled battery 10, the battery properties of the battery modules 11 having a usage history need to be evaluated in order to select the battery modules 11 having superior battery properties. Conventional selection methods include a method for selecting the battery module 11 having the open end voltage, the internal resistance, and the battery mass that are in the tolerable range and a method for analyzing the impedance of the battery module 11 when AC voltage is applied. However, the study conducted by the inventors has revealed that the battery modules 11, which are selected as having superior battery properties in the above methods, may include the battery modules 11 having a decreased battery capacity.

A battery capacity that is suitable for rebuilding will now be described with reference to FIG. 2.

Figures 2A, 2B, 2C:
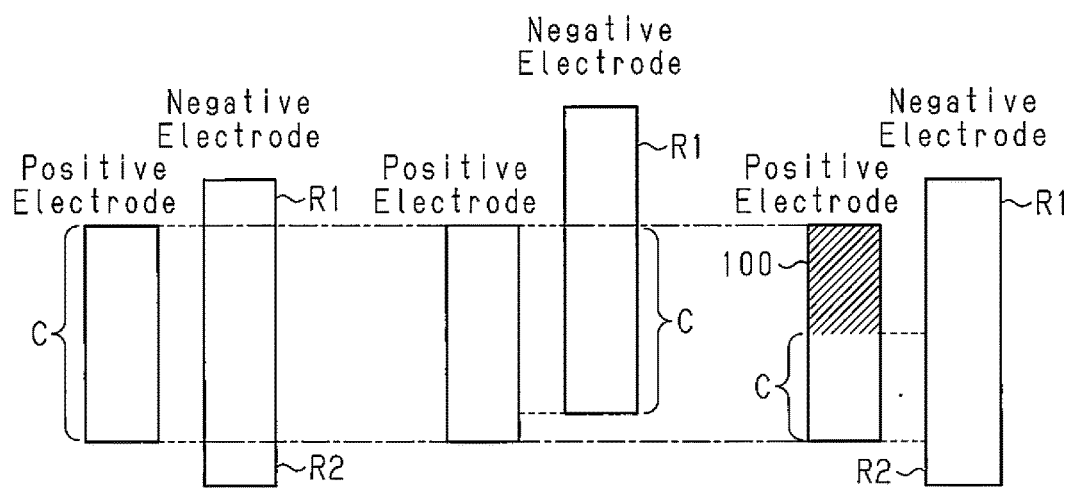
FIG. 2A is a schematic diagram illustrating a normal balance between the capacity of a positive electrode and the capacity of a negative electrode.
FIG. 2B is a schematic diagram illustrating an abnormal capacity balance caused by the negative electrode.
FIG. 2C is a schematic diagram illustrating an abnormal capacity balance caused by the positive electrode.

FIG. 2A illustrates the capacity balance between the positive electrode and the negative electrode of the battery module 11 having no usage history. In a nickel-metal hydride battery, the negative electrode is set to have a larger capacity than the positive electrode. The negative electrode includes a charge reserve R1 so that the negative electrode absorbs oxygen and does not produce hydrogen during overcharging. The charge reserve R1 has a capacity that may be charged when the positive electrode is fully charged. The negative electrode also includes a discharge reserve R2 so that the battery capacity may not be restricted by the negative electrode during discharging. The discharge reserve R2 has a capacity that may be discharged when the charge amount of the positive electrode is zero. Thus, in the battery module 11 having no usage history, the capacity C of the nickel-metal hydride battery is restricted by the positive electrode. Such capacity restriction is referred to as the positive electrode restriction. The state of the positive electrode being "fully charged" refers to a state in which the positive active material does not include any uncharged portion.

As illustrated in FIG. 2B, when hydrogen of the hydrogen adsorption alloy, which is the negative active material, is released to the outside of the battery container, the discharge reserve R2 is decreased. As the discharge reserve R2 further decreases, the discharge reserve R2 becomes "negative" and the capacity balance of the battery cell is lost. As a result, the capacity of the negative electrode restricts the capacity C of the battery cell. Such capacity restriction is referred to as the negative electrode restriction. When the battery module 11 includes at least one of the battery cells in which the capacity balance is under the negative electrode restriction, the capacity C of the battery cell decreases. Additionally, the battery cell having the negative electrode restriction restricts the capacity of other battery cells. This decreases the battery capacity of the battery module 11.

The inventors analyzed the battery module that was selected as a non-defective product in the conventional selection methods. As a result, it was revealed that in the conventional methods, the battery module 11 having a decreased battery capacity due to the abnormal capacity balance can be selected as a defective product. However, the conventional methods have a lower accuracy for selecting a battery module in which the positive electrode has a decreased capacity.

As illustrated in FIG. 2C, even when nickel hydroxide, which is the positive active material, is changed to an inactive state, and the capacity of the positive electrode is decreased by a capacity decreased amount 100, the capacity C of the battery cell is decreased. It is understood that the decreases in the capacity of the positive electrode may be caused by the memory effect. However, when the capacity of the positive electrode is decreased, the capacity C is decreased by an amount that is significantly greater than typical capacity decrease amount caused by the memory effect. The conventional methods may not determine a battery module of which the battery capacity is decreased due to a decreased capacity of the positive electrode as a defective product.

A rebuilding method for evaluating the battery module 11 and constructing the assembled battery 10 will now be described. The method for rebuilding the assembled battery 10 includes, for example, steps (a) to (f) described below.

During and prior to a remaining charge inspection step (b), charging of the battery module 11 to a predetermined charge amount or greater is restrained. When the positive electrode has a decreased capacity and charged, oxygen produced from the positive electrode may cause the battery module 11 to generate heat, which will be described later. Therefore, charging of the battery module 11 to the predetermined charge amount or greater is restrained until the remaining charge inspection step is completed. The "predetermined charge amount" only needs to be an amount so that oxygen will not be produced from the positive electrode even when the positive electrode has the decreased capacity. A preferred mode includes restraining charging or conducting pulse charging during and prior to the remaining charge inspection step.

(a) a step of dismantling the assembled battery 10 into the battery modules 11 (dismantling step)

(b) a step of inspecting the remaining charge of the battery modules 11 (remaining charge inspection step)

(c) a step of inspecting the open end voltage, the internal resistance, and the battery mass of the battery modules 11 (property inspection step)

(d) a step of inspecting the capacity balance of the battery modules 11 (capacity balance inspection step)

(e) a step of charging the battery modules 11 that are selected as a non-defective product (refreshment charge step)

(f) a step of assembling the assembled battery 10 using the selected battery modules 11 (assembling step)

When the assembled battery 10 is collected from the vehicle, it is first determined whether or not the assembled battery 10 is usable without being dismantled. To determine the usability, any process may be used such as inspection of the battery properties or inspection of variations in the battery properties of each battery module 11.

When it is determined that the assembled battery 10 is not reusable without being dismantled, the assembled battery 10 is dismantled into the battery modules 11 (a: dismantling step).

Then, the remaining charge of the battery modules 11 is inspected (b: remaining charge inspection step). As described above, when installed in the vehicle, the assembled battery 10 is controlled so that the SOC of the assembled battery 10 is in the control range. Thus, even when the assembled battery 10 is uninstalled, the SOC of the assembled battery 10 is maintained if the battery modules 11 have the proper battery capacity. Also, the remaining charge of the battery modules 11 is maintained in a given charge range (range corresponding to the SOC control range). Therefore, the remaining charge of the battery modules 11 substantially does not decrease to less than a vehicle control lower limit value, which corresponds to the lower limit value of the given charge range. However, in the battery module 11 in which the positive electrode has the decreased capacity, the remaining charge may be less than the vehicle control lower limit value. Thus, to select (eliminate) the battery module 11 in which the positive electrode has a decreased capacity, a remaining charge lower limit value is set to be in a range that is greater than zero and less than the vehicle control lower limit value. As described above, charging of the battery module 11 to the predetermined charge amount or greater is restrained during and prior to the remaining charge inspection step, that is, until the remaining charge inspection step is completed. It is preferred that the "predetermined charge amount" be an amount that does not reach the remaining charge lower limit value.

In the vehicle, the SOC of the assembled battery 10 is an estimated value. Thus, the remaining charge corresponding to the SOC of the assembled battery 10 may be deviated from the actual remaining charge of each battery module 11. Therefore, when the remaining charge of the battery module 11 is less than the vehicle control lower limit value but proximate to the vehicle control lower limit value, the probability that the battery module 11 is a non-defective product is high. Thus, the preferred remaining charge lower limit value may be, for example, 80% of the vehicle control lower limit value. When the remaining charge lower limit value is set in this manner, the non-reusable battery module 11, in which the positive electrode has the decreased capacity, may be appropriately selected and eliminated. Additionally, the non-defective battery module 11 in which the remaining charge is less than the vehicle control lower limit value may be reused. When the remaining charge lower limit value is set to 60% of the vehicle control lower limit value, more reusable battery modules 11 may be selected. When the remaining charge lower limit value is further set to 40% and 20% of the vehicle control lower limit value, the selected reusable battery modules 11 may be increased in a stepped manner.

Figure 3:
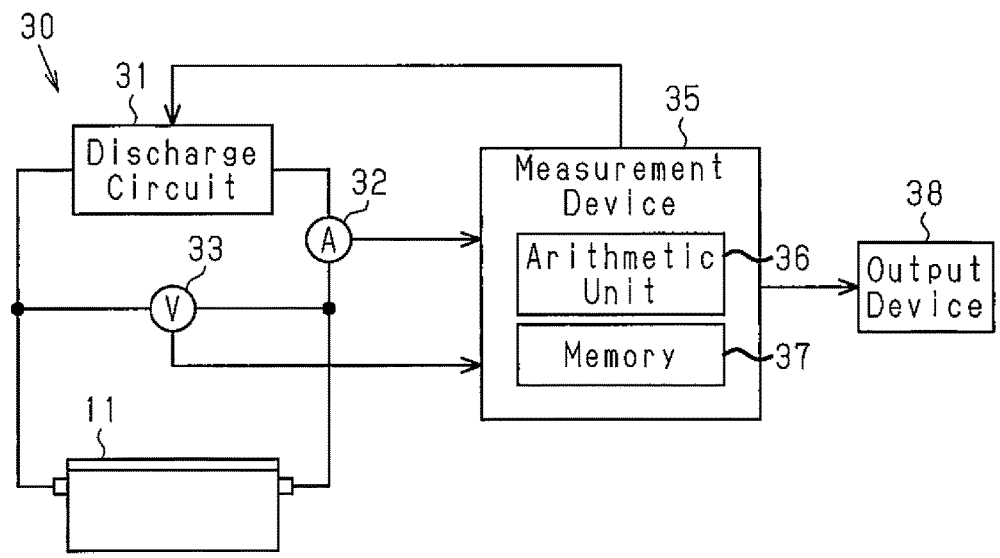
FIG. 3 is a schematic diagram illustrating the structure of a measurement device that measures the remaining charge in one embodiment of a method for reusing a vehicle rechargeable battery.

The structure of an inspection device 30, which performs the remaining charge inspection step, will now be described with reference to FIG. 3. The inspection device 30 includes a discharge circuit 31, which discharges the battery module 11, a current meter 32, which measures current flowing to the discharge circuit 31, and a voltage meter 33, which measures voltage between terminals of the battery module 11. The discharge circuit 31 continues to discharge the battery module 11 until the voltage of the battery module 11 reaches a predetermined voltage, for example, a termination voltage.

The current meter 32 and the voltage meter 33 transmit measurement signals to the measurement device 35. The measurement device 35 includes an arithmetic unit 36 and a memory 37. In accordance with a measurement program stored in the memory 37, the arithmetic unit 36 calculates the remaining charge of the battery module 11 by accumulating the current until the voltage of the battery module 11 reaches the predetermined voltage such as the termination voltage.

The arithmetic unit 36 also compares the calculated remaining charge with the remaining charge lower limit value, which is stored in the memory. The vehicle control lower limit value, which serves as a reference for setting the remaining charge lower limit value, may be obtained by announcement or notification from the maker or obtained from the monitor unit 25 of the vehicle. Thus, the remaining charge lower limit value may be set by multiplying the vehicle control lower limit value by a specified value, for example, 80%, and stored in the memory 37 in advance. The vehicle control lower limit value is obtained by converting the SOC lower limit value in the control range of the monitor unit 25 into a lower limit value in a range per battery module 11. When the calculated remaining charge is greater than or equal to the remaining charge lower limit value, the arithmetic unit 36 determines that the remaining charge of the battery module 11 is appropriate. When the calculated remaining charge is less than the remaining charge lower limit value, the arithmetic unit 36 determines that the remaining charge of the battery module 11 is inappropriate. The arithmetic unit 36 transmits a determination result, which indicates that the battery module 11 is non-defective or defective, to an output device 38, for example, a display.

The conventional methods for selecting the battery modules also perform an inspection process in which the remaining charge of the battery module is calculated and compared with a reference value (refer to Japanese Laid-Open Patent Publication No. 2011-216328). However, in the conventional methods, the reference value is set to be greater than the remaining charge lower limit value of a range that can be expected for normal use of the rechargeable battery. Thus, the conventional remaining charge inspection may eliminate the battery module that should be selected as a non-defective product. This decreases the selection accuracy.

Figure 4:
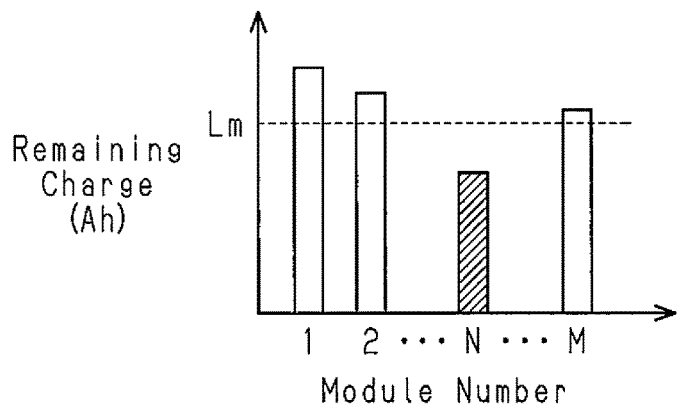
FIG. 4 is a graph illustrating the remaining charge of a plurality of battery modules included in the assembled battery.

FIG. 4 is a graph illustrating the remaining charge of each of an M number of the battery modules 11 included in the assembled battery 10. The $N^{th}$ battery module 11, in which the remaining charge (unit: Ah) is less than a remaining charge lower limit value Lm (remaining charge lower limit value Lm is set to be less than the vehicle control lower limit value), is eliminated from the M number of the battery modules 11 as a defective product. The battery modules 11 in which the remaining charge is greater than or equal to the remaining charge lower limit value Lm continue the inspection in the next step.

The battery module 11 determined having the appropriate remaining charge undergoes the inspection of the open end voltage, the internal resistance, and the battery mass (c: property inspection step). In this step, the open end voltage of the battery module 11 is measured and determined whether or not the measured open end voltage is in a tolerable range of the open end voltage. The inspection of the open end voltage has the same effect as a conventional inspection that checks whether or not the remaining charge of the battery module is in a tolerable range of the remaining charge. Thus, when the open end voltage is inspected, the conventional inspection, which checks the remaining charge of the battery module 11, does not have to be performed. Also, the internal resistance of the battery module 11 is measured and determined whether or not the measured internal resistance is in a tolerable range of the internal resistance. Additionally, it is determined whether or not the battery mass of the battery module 11 is in a tolerable range of the battery mass. The tolerable range of the open end voltage, the tolerable range of the internal resistance, and the tolerable range of the battery mass are set based on the battery properties of the standard battery module 11. In this step, only at least one of the open end voltage, the internal resistance, and the battery mass needs to be inspected.

When it is determined that the battery module 11 has the appropriate remaining charge and that the open end voltage, the internal resistance, and the battery mass are each in the corresponding tolerable range, the capacity balance of the battery module 11 is inspected (d: capacity balance inspection step). The present embodiment uses an impedance process in which AC voltage or AC current is applied to the battery module 11 to analyze the impedance of the battery module 11. In this process, the battery module 11 first needs to be discharged until the charge ratio reaches, for example, 0%. Here, since the remaining charge inspection is performed in advance, the battery module 11 has been discharged. This eliminates the step of discharging the battery module 11 or shortens the discharge time in the capacity balance inspection step. When the battery module 11 is discharged until the charge ratio reaches 0%, the charge amount of the positive electrode is 0% if the battery is normal, and the charge amount of the negative electrode is 0% if the battery has the negative electrode restriction.

The battery module 11 is connected to a measurement electrode and applied with AC voltage as changing the frequency. The impedance measurement device measures the complex impedance of the battery module 11.

Figure 5:
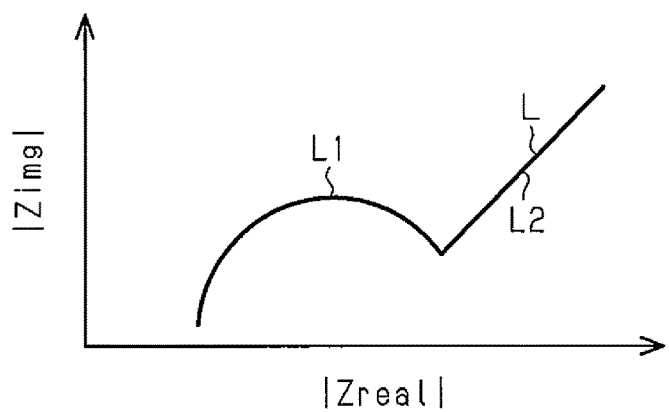
FIG. 5 is a graph illustrating changes in the real component and the imaginary component of a complex impedance when AC voltage is applied to the battery module.

As illustrated in FIG. 5, the complex impedance of the battery module 11 is expressed by the real component and the imaginary component. In the graph of FIG. 5, the horizontal axis corresponds to the absolute value of a real component Zreal, and the vertical axis corresponds to the absolute value of an imaginary component Zimg. The complex impedance curve L includes a curve L1, which is an arcuate portion and located at a high frequency side, and a straight line L2, which is substantially a straight line. The straight line L2 corresponds to the impedance of a diffusion region where substance diffusion is involved.

It is known that when the discharge reserve is drained and the battery module 11 functions as the negative electrode restriction, the straight line L2 of the diffusion region is steeply sloped and has a small inclination angle compared to the battery module 11 having the appropriate capacity balance. To detect the inclination of the straight line L2, AC voltages of at least two frequencies in the diffusion region are applied to the battery module 11. The applied frequencies are, for example, 0.1 Hz and 0.5 Hz. The impedance measurement device measures the complex impedance of the battery module 11. An impedance analysis device calculates the inclination angle of the complex impedance in the diffusion region. The impedance analysis device also compares the inclination angle with a threshold value stored in the memory. When the inclination angle of the battery module 11 is less than the threshold value, it is determined that the battery module 11 has the negative discharge reserve and the abnormal capacity balance. When the inclination angle is greater than or equal to the threshold value, it is determined that the battery module 11 maintains the discharge reserve and has the normal capacity balance.

The battery module 11 is selected as the battery module 11 capable of rebuilding when determined that the remaining charge is greater than or equal to the remaining charge lower limit value, that the capacity balance is normal in the capacity balance inspection step, and that the battery properties such as the open end voltage are in the tolerable ranges. The capacity balance inspection step (d) may be performed prior to the remaining charge inspection step (b). Additionally, the property inspection step (c) may be performed prior to the remaining charge inspection step (b) or subsequent to the capacity balance inspection step (d). The battery module 11 that is determined being appropriate in a single inspection step only undergoes the next inspection step. Instead, the battery module 11 that is determined being inappropriate in the single inspection step may also undergo the next inspection step as long as the battery module having the inappropriate remaining charge is not charged. Consequently, two or more inspection results may be comprehensively used to determine whether or not each battery module 11 is a non-defective product.

The selected battery module 11 is connected to a charge circuit and charged to a predetermined voltage (e: refreshment charge step). Here, the battery module 11 is discharged and then charged (refreshment charge). This limits the memory effect of the positive electrode.

It is known that when the refreshment charge is performed without eliminating the battery module 11 in which the remaining charge is less than the remaining charge lower limit value in the remaining charge inspection step, the battery module 11 having the remaining charge being less than the remaining charge lower limit value generates heat. More specifically, when the capacity of the positive electrode is decreased, the positive electrode becomes incapable of charging with a small power amount and produces oxygen. In this case, the produced oxygen is coupled to hydrogen produced from the negative electrode and generates heat. Thus, the remaining charge inspection step is performed prior to the refreshment charge step so that the battery module 11, which may generate heat, is removed in advance. Additionally, in the remaining charge inspection step, the battery module 11 is discharged to the predetermined voltage. Thus, when the refreshment charge is performed subsequent to the remaining charge inspection step, the step of discharging the battery module 11 is omitted. This shortens the inspection time.

The battery modules 11 of the predetermined number of the battery modules 11 that have undergone the refreshment charge step are coupled as the assembled battery 10 (f: assembling step). In this case, to reduce variations in the battery properties among the battery modules 11, it is preferred that the assembled battery 10 is formed by combining the battery modules 11 having similar battery properties such as, the open end voltage, the remaining charge detected in the remaining charge inspection step, and the internal resistance.

The present embodiment has the advantages described below.

(1) The vehicle in which the assembled battery 10 is installed is controlled so that the remaining charge of the assembled battery 10 is in the control range (remaining charge control range), which is appropriate to the controlling of the vehicle. The control range differs from the tolerable range, which is determined in accordance with the specification of the assembled battery 10, and is generally set to be narrower than the tolerable range. Thus, when the collected assembled battery 10 includes the normal battery modules 11, the remaining charge of the assembled battery 10 is maintained in the control range. In the present embodiment, the remaining charge lower limit value is set to be in a range that is greater than zero and less than the lower limit value (vehicle control lower limit value) of the remaining charge control range in the vehicle. When the assembled battery 10 having a usage history is dismantled into the battery modules 11, the battery module 11 in which the measured remaining charge is greater than or equal to the remaining charge lower limit value is selected for reuse. The non-defective battery module 11 is hardly ever decreased to below the vehicle control lower limit value. On the other hand, the battery module 11 in which the positive electrode has the decreased capacity is generally decreased to below the vehicle control lower limit value. Thus, when the remaining charge is compared with the remaining charge lower limit value, the non-defective battery unit is properly selected as a non-defective product, and the defective battery unit is properly selected as a defective product. This further increases the accuracy for evaluating the battery module 11.

(2) The remaining charge lower limit value is set to be less than or equal to 80% of the vehicle control lower limit value. This appropriately eliminates the non-reusable battery module 11, in which the positive electrode has the decreased capacity.

(3) In addition to the remaining charge inspection step, which selects the battery module 11 having the remaining charge being greater than or equal to the remaining charge lower limit value, the step for selecting the battery unit having the normal capacity balance between the positive electrode and the negative electrode is performed. Thus, the battery module 11 having an abnormal remaining charge due to different factors may be selected (eliminated). This further increases the accuracy for evaluating the battery module 11.

(4) The inclination angle of the complex impedance of the battery module 11 in the diffusion region is decreased when the battery module 11 is abnormal. In the present embodiment, the capacity balance is determined based on the comparison of the inclination angle of the complex impedance of the battery module 11 with the threshold value. Thus, the battery unit having the normal capacity balance may be selected.

(5) The property inspection step, which inspects the open end voltage, the internal resistance, and the battery mass, is performed in addition to the remaining charge inspection step. The combination of the property inspection step and the remaining charge inspection step allows for the selection (elimination) of the battery module 11 that is deteriorated by a different factor from the battery module 11 that is determined being defective in the remaining charge inspection step. This further increases the accuracy for evaluating the battery module 11.

(6) It is known that when charging the battery module 11 in which the remaining charge is less than the remaining charge lower limit value, the battery module 11 generates heat. In the present embodiment, during and prior to the remaining charge inspection step, in which the non-defective battery module 11 is selected, the battery module 11 is not charged to the predetermined charge amount or greater. Thus, the battery module 11 that generates heat when charged may be eliminated in advance.

(7) When the battery module 11 is charged after being discharged to the predetermined voltage, the memory effect is limited. However, it is known that the battery module 11 in which the remaining charge is less than the remaining charge lower limit value generates heat when charged. In the above embodiment, the battery module 11 in which the remaining charge is less than the remaining charge lower limit value is selected (eliminated) as a defective product in the remaining charge inspection step. Thus, the battery module 11 that generates heat when charged may be eliminated in advance prior to the refreshment charge step. Additionally, to perform the refreshment charge, the battery unit needs to be discharged before being charged. However, the combination of the refreshment charge step and the remaining charge inspection step reduces the burden of discharging the battery module 11 in the refreshment charge step.

(8) The vehicle control lower limit value of the assembled battery 10 is set to be greater than or equal to 40% in the charge ratio. Thus, when the remaining charge lower limit value is set to 80% of the vehicle control lower limit value and the assembled battery 10 is collected, the battery module 11 in which the remaining charge is less than 32%, which corresponds to 80% of the vehicle control lower limit value, in the charge ratio is selected as a defective product. This allows for the selection of the battery module 11 that would not be evaluated whether or not being non-defective in the conventional selection methods.

It should be apparent to those skilled in the art that the foregoing embodiments may be employed in many other specific forms without departing from the scope of the invention. Particularly, it should be understood that the foregoing embodiments may be employed in the following forms.

Although illustrated to be elongated box-shaped, the battery module 11 may be tubular.

In the above embodiment, the battery modules 11 selected as the non-defective product individually undergo the refreshment charge. Instead, the assembled battery 10 including the battery modules 11, which are selected as the non-defective product, may undergo the refreshment charge.

In addition to the remaining charge inspection step (b) and the capacity balance inspection step (b), a further inspection step may be performed to select the battery module 11. The further inspection step may determine that the battery module is normal, for example, when the battery properties such as the open end voltage and the internal resistance are within the absolute tolerable range, which is set regardless of the individual variability of each assembled battery 10, and also within the relative tolerable range, which is set for each assembled battery 10.

In the above embodiment, although the impedance process is used in the capacity balance inspection step, a different process may be used instead of the impedance process.

In the above embodiment, the inclination angle of the straight line of the complex impedance curve is calculated in the capacity balance inspection step. Instead, the inclination angle of an approximation straight line of the straight line may be calculated.

In the above embodiment, the battery unit is the battery module 11 including a plurality of battery cells. Instead, the battery unit may be a battery cell.

In the above embodiment, the assembled battery 10 is illustrated as the power source for driving the vehicle. Instead, the assembled battery 10 may be a power source used for different application.

In the above embodiment, the assembled battery 10 is a nickel-metal hydride battery. Instead, the assembled battery 10 may be a different kind of battery such as a lithium-ion battery.

The present examples and embodiments are to be considered as illustrative and not restrictive, and the invention is not to be limited to the details given herein, but may be modified within the scope and equivalence of the appended claims.

The invention claimed is:

1. A method for reusing a vehicle rechargeable battery to rebuild an assembled battery from a plurality of battery units having a usage history, the method comprising:
    measuring a remaining charge of each of a plurality of battery units obtained by dismantling an assembled battery having a usage history associated with a vehicle in which the assembled battery was installed, the usage history including a remaining charge control range of the vehicle, the remaining charge control range including a lower limit value;
    measuring an internal resistance of each of the plurality of battery units;
    selecting from the plurality of battery units a battery unit in which:
        the measured remaining charge is greater than or equal to a remaining charge threshold value $L_m$, wherein the remaining charge threshold value $L_m$ is greater than zero and less than the lower limit value of the remaining charge control range; and
        the measured internal resistance is in a predetermined range; and
    assembling a new assembled battery using the selected battery unit.

2. The method according to claim 1, wherein the remaining charge threshold value $L_m$ is less than or equal to 80% of the lower limit value of the remaining charge control range.

3. The method according to claim 1, further comprising selecting from the plurality of battery units a battery unit in which a capacity balance is normal between a positive electrode and a negative electrode.

4. The method according to claim 3, wherein
    the selecting from the plurality of battery units a battery unit in which a capacity balance is normal includes
        measuring a first complex impedance of the battery unit at a first frequency in a diffusion region,
        measuring a second complex impedance of the battery unit at a second frequency in the diffusion region,
        calculating an inclination angle of a straight line or an approximation straight line that connects on a graph the first and second complex impedances of the battery unit corresponding to the first and second frequencies in the diffusion region, and
        determining whether or not the capacity balance is normal by comparing the inclination angle with a threshold value.

5. The method according to claim 1, further comprising, after selecting the battery unit in which the measured remaining charge is greater than or equal to the remaining charge threshold value $L_m$, charging the battery unit to a predetermined charge amount or greater.

6. The method according to claim 1, further comprising charging the selected battery unit or the new assembled battery including the selected battery unit.

7. The method according to claim 1, wherein
    the remaining charge control range of the assembled battery is specified by a charge ratio that indicates a ratio of a charge amount relative to a charge capacity of the assembled battery, and
    the lower limit value of the remaining charge control range is set to be greater than or equal to 40% in the charge ratio.

8. The method according to claim 1, further comprising measuring at least one of open end voltage and batter massy for each battery unit, wherein the selecting further comprises selecting from the plurality of battery units a battery unit in which at least one of:
    the measured open end voltage is in an open end voltage tolerable range; or
    the measured battery mass is in a battery mass tolerable range.

* * * * *